(12) United States Patent  
Furusawa et al.

(10) Patent No.: US 7,602,063 B2  
(45) Date of Patent: Oct. 13, 2009

(54) SEMICONDUCTOR DEVICE AND MANUFACTURING METHOD THEREFOR

(75) Inventors: Takeshi Furusawa, Tokyo (JP); Noriko Miura, Tokyo (JP); Kinya Goto, Tokyo (JP); Masazumi Matsuura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 294 days.

(21) Appl. No.: 11/172,871

(22) Filed: Jul. 5, 2005

(65) Prior Publication Data  
US 2006/0006530 A1    Jan. 12, 2006

(30) Foreign Application Priority Data  
Jul. 6, 2004    (JP)    ............... 2004-199709

(51) Int. Cl.  
*H01L 23/48*    (2006.01)  
*H01L 23/52*    (2006.01)  
*H01L 29/40*    (2006.01)

(52) U.S. Cl. ........................ 257/750; 257/734

(58) Field of Classification Search ............... 257/750  
See application file for complete search history.

(56) References Cited  
U.S. PATENT DOCUMENTS

| | | | |
|---|---|---|---|
| 6,358,838 B2 | 3/2002 | Furusawa et al. | |
| 6,680,541 B2 | 1/2004 | Furusawa et al. | |
| 6,740,602 B1 | 5/2004 | Hendriks et al. | |
| 2003/0162410 A1* | 8/2003 | Huang et al. | 438/780 |
| 2003/0201465 A1* | 10/2003 | Ryuzaki et al. | 257/200 |
| 2004/0033373 A1* | 2/2004 | Rose et al. | 428/447 |

FOREIGN PATENT DOCUMENTS

| | | |
|---|---|---|
| JP | 2000-340569 | 12/2000 |
| JP | 2000-349083 | 12/2000 |
| JP | 2001-203200 | 7/2001 |
| JP | 2002-329718 | 11/2002 |

OTHER PUBLICATIONS

Machine Translation of JP 2000-340569.*  
Machine Translation of JP 2002-329718.*  
M. Inohara, et al., "High Performance Copper and Low-k Interconnect Technology Fully Compatible to 90nm-node SOC Application (CMOS4)", Technical Digest of 2002 IEDM, pp. 77-80.

* cited by examiner

*Primary Examiner*—Kenneth A Parker  
*Assistant Examiner*—Anthony Ho  
(74) *Attorney, Agent, or Firm*—Oblon, Spivak, McClelland, Maier & Neustadt, L.L.P.

(57) ABSTRACT

In a semiconductor having a multilayer wiring structure device on a semiconductor substrate, the multilayer wiring structure includes an interlayer insulating film having at least an organic siloxane insulating film. The organic siloxane insulating film has a relative dielectric constant of 3.1 or less, a hardness of 2.7 GPa or more, and a ratio of carbon atoms to silicon atoms between 0.5 and 1.0, inclusive. Further, the multilayer wiring structure may include an insulating layer having a ratio of carbon atoms to silicon atoms not greater than 0.1, the insulating layer being formed on the top surface of the organic siloxane insulating film as a result of carbon leaving the organic siloxane insulating film.

13 Claims, 11 Drawing Sheets

SEMICONDUCTOR DEVICE AND MANUFACTURING METHOD THEREFOR

BACKGROUND OF THE INVENTION

1. Field of the Invention

The present invention relates to a semiconductor device and a manufacturing method therefor, and more particularly to a semiconductor device including a low dielectric constant film and a manufacturing method therefor.

2. Background Art

In recent years, an increasing number of semiconductor devices have employed a multilayer wiring structure to achieve miniaturization and high speed operation. However, this has raised the problem of signal delay due to an increase in the wiring resistance and in the parasitic capacitance between the wires and between the wiring layers. Signal delay T is proportional to the product of wiring resistance R and parasitic capacitance C. Therefore, reducing the signal delay T requires reducing the parasitic capacitance as well as reducing the resistance of the wiring layers.

Low resistance wiring material may be used to reduce the wiring resistance R. Specifically, copper (Cu) wiring may be used instead of the conventional aluminum (Al) wiring.

The parasitic capacitance between two wiring layers is related to the relative dielectric constant of the interlayer insulating film provided between the wiring layers by the equation: $C=(e \cdot S)/d$, where C is the parasitic capacitance, e is the relative dielectric constant, S is the side area of the wiring layers, and d is the distance between the wiring layers. Therefore, reducing the parasitic capacitance C requires reducing the dielectric constant of the interlayer insulating film. To achieve this, efforts are being made to develop and use an insulating film having lower relative dielectric constant than conventional $SiO_2$ films (having a relative dielectric constant of 3.9) as the interlayer insulating film. (Such a low dielectric constant insulating film is hereinafter referred to as "Low-k film".) Especially, organic siloxane insulating films are attracting attention since they can achieve a relative dielectric constant of 3.1 or less.

An organic siloxane insulating film can be formed by the chemical vapor deposition method (hereinafter referred to as "CVD method") or a spin coat method. In either way, the formed organic siloxane insulating film has a structure made up of a network formed of Si—O—Si bonds and Si—R (R: an organic group) bond side chains. It should be noted that $CH_3$, which has good heat resistance, is typically used as R. The organic siloxane insulating film may include Si—H bonds or Si—C—Si bonds as other components. Further, unreacted substances or reaction byproducts including C may remain within the insulating film as impurities.

A typical CVD method for forming an organic siloxane insulating film uses organic silane and oxidizing gas. Another known method uses an alkoxysilane such as $R_2Si(OR')_2$ or $R_4Si_2O(OR')_2$ (where R and R' each represent $CH_3$) and an inert gas and forms the film by retaining the material gas within the reaction chamber under long residence time condition (see, e.g., Patent Document 1). The organic siloxane insulating films formed by these methods generally have a hardness of 2 GPa or less.

Still another known method uses another type of alkoxysilane, namely $R_nSi(OR')_{3-n}$ (where: R represents $CH_3$; R' represents $CH_3$ or $C_2H_5$; and $0.75 \leq n \leq 1.5$). This method mixes the alkoxysilane with an inert gas and forms an organic siloxane insulating film by retaining the material gas within the reaction chamber under short residence time condition (see, e.g., Patent Document 2). The organic siloxane insulating film produced by this method has a hardness of 4.4 GPa and a ratio of carbon atoms to silicon atoms between 1 and 2, inclusive, that is, $1 \leq (C/Si) \leq 2$.

On the other hand, organic siloxane insulating films produced by the spin coat method are known to have a relative dielectric constant of 3 or less and a Young's modulus of less than 50 GPa (see, e.g., Patent Document 3). In this case, a protective film having a Young's modulus of 50 GPa or more must be laminated onto the organic siloxane insulating film to protect the insulating film from mechanical damage during wire bonding.

Incidentally, a known method for forming copper wiring by using a Low-k film employs a damascene technique. This technique forms copper wiring without etching the copper, since the etching of copper is more difficult to control than that of aluminum.

Specifically, the damascene technique performs the following steps: forming an $SiO_2$ film on the Low-k film; dry-etching these films using a resist pattern as a mask to form an opening; and forming a barrier metal film on the opening and filling the opening with a copper layer to form a copper wiring layer. Specifically, after forming the copper layer by use of a plating technique such that the opening is buried under the copper layer, the surface is polished by the chemical mechanical polishing method (hereinafter referred to as "CMP method") such that the copper layer remains only within the opening.

[Patent Document 1]
Japanese Laid-Open Patent Publication No. 2000-349083
[Patent Document 2]
Japanese Laid-Open Patent Publication No. 2001-203200
[Patent Document 3]
Japanese Laid-Open Patent Publication No. 2000-340569

When an organic siloxane insulating film is used as the Low-k film, the CMP process polishes off (or removes) the entire $SiO_2$ film and part of the organic siloxane insulating film to ensure flatness of the surface. After that, a plasma treatment is carried out to reduce the surface of the copper layer and clean the surface of the organic siloxane insulating film. Then, a barrier insulating film is formed on the surfaces of the copper layer and the organic siloxane insulating film to prevent diffusion of copper. However, the above reducing plasma treatment process has a problem in that a layer with altered properties (referred to hereinafter as "an altered layer") is formed on the surface of the organic siloxane insulating film due to reduction of carbon within the organic siloxane insulating film.

The altered layer has poorer electrical characteristics than the original insulating layer, resulting in a degradation in the insulation characteristics between the adjoining layers. This problem worsens with decreasing wiring distance.

To address this problem, an $SiO_2$ film may be deposited on the organic siloxane insulating film to a large thickness (approximately 100 nm) and the above CMP method may be carried out such that the surface of the $SiO_2$ film is exposed after the polishing, instead of the organic siloxane insulating film. Since the $SiO_2$ film contains substantially no carbon, this method can prevent formation of an altered layer due to the reducing plasma treatment. However, the $SiO_2$ film has a high relative dielectric constant, which prevents the effective parasitic capacitance C between wires from being reduced.

Further, the above degradation of the electrical characteristics is dependent on the thickness of the altered layer; the thinner the thickness of the layer, the better the electrical characteristics. To reduce the thickness of the altered layer, the reducing plasma treatment time may be reduced. However, this leads to insufficient reduction of the copper layer surface and insufficient cleaning of the insulating film surface, which is not desirable.

Use of an insulating film of the type in which the above altered layer is hardly formed eliminates the need for forming an $SiO_2$ film on the insulating film. For example, the above insulating film formed of $R_nSi(OR')_{3-n}$ is of such type. However, since this film contains a very large amount of carbon, a sufficient etching selectivity ratio cannot be ensured during dry-etching the film using a resist pattern as a mask.

SUMMARY OF THE INVENTION

The present invention has been devised in view of the above problems. It is, therefore, an object of the present invention to provide a semiconductor device having good electrical characteristics by using an organic siloxane insulating film.

Another object of the present invention is to provide a method for manufacturing a semiconductor device having good electrical characteristics by using an organic siloxane insulating film.

According to one aspect of the present invention, a semiconductor device comprises a multilayer wiring structure on a semiconductor substrate. The multilayer wiring structure includes an interlayer insulating film having at least an organic siloxane insulating film. The organic siloxane insulating film has a relative dielectric constant of 3.1 or less, a hardness of 2.7 GPa or more, and a ratio of carbon atoms to silicon atoms between 0.5 and 1.0, inclusive.

According to another aspect of the present invention, in a method for manufacturing a semiconductor device having a multilayer wiring structure, a first insulating film is formed on underlayer wiring on a semiconductor substrate. A second insulating film is formed on the first insulating film. A third insulating film is formed on the second insulating film. Dry-etching of the third, second, and first insulating films are carried out to form an opening reaching the underlayer wiring. A barrier metal film is formed on the inner surface of the opening and on the third insulating film. A conductive layer is formed on the barrier metal film such that the opening is buried under the conductive layer. The conductive layer, the barrier metal film, the third insulating film, and a portion of the second insulating film are removed by use of a chemical mechanical polishing technique such that the conductive layer and the barrier metal film still remain in the opening so as to form upper layer wiring electrically connected to the underlayer wiring. A reducing plasma treatment is applied to the exposed surface of the second insulating film and the exposed surface of the conductive layer. The second insulating film forming step includes forming an insulating film under a pressure of 500 Pa or less by use of a plasma CVD technique using alkylalkoxysilane and a nonoxidizing gas as source gases. The alkylalkoxysilane is represented by the formula $R_wSi_xO_y(OR')_z$. R and R' each represent $CH_3$. w, x, and z denote positive integers. y denotes 0 or a positive integer. (w/x) is equal to 2.

According to other aspect of the present invention, in a method for manufacturing a semiconductor device having a multilayer wiring structure, a first insulating film is formed on underlayer wiring on a semiconductor substrate. A second insulating film is formed on the first insulating film. A third insulating film is formed on the second insulating film. Dry-etching of the third, second, and first insulating films are carried out to form an opening reaching the underlayer wiring. A barrier metal film is formed on the inner surface of the opening and on the third insulating film. A conductive layer is formed on the barrier metal film such that the opening is buried under the conductive layer. The conductive layer, the barrier metal film, the third insulating film, and a portion of the second insulating film are removed by use of a chemical mechanical polishing technique such that the conductive layer and the barrier metal film still remain in the opening so as to form upper layer wiring electrically connected to the underlayer wiring. A reducing plasma treatment is applied to the exposed surface of the second insulating film and the exposed surface of the conductive layer. The second insulating film forming step includes forming an insulating film having a predetermined thickness under a pressure of 650 Pa or more by use of a plasma CVD technique using alkylalkoxysilane and a nonoxidizing gas as material gases, and forming another insulating film after reducing the pressure to 500 Pa or less. The alkylalkoxysilane is represented by the following formula $R_wSi_xO_y(OR')_z$. w, x, and z denote positive integers. y denotes 0 or a positive integer. R and R' each represent $CH_3$. (w/x) is equal to 2.

According to other aspect of the present invention, in a method for manufacturing a semiconductor device having a multilayer wiring structure, a first insulating film is formed on underlayer wiring on a semiconductor substrate. A second insulating film is formed on the first insulating film. A third insulating film is formed on the second insulating film. A fourth insulating film is formed on the third insulating film. Dry-etching of the fourth, third, second, and first insulating films are carried out to form an opening reaching the underlayer wiring. A barrier metal film is formed on the inner surface of the opening and on the fourth insulating film. A conductive layer is formed on the barrier metal film such that the opening is buried under the conductive layer. The conductive layer, the barrier metal film, the fourth insulating film, and a portion of the third insulating film are removed by use of a chemical mechanical polishing technique such that the conductive layer and the barrier metal film still remain in the opening so as to form upper layer wiring electrically connected to the underlayer wiring. A reducing plasma treatment is applied to the exposed surface of the third insulating film and the exposed surface of the conductive layer. The second insulating film has a lower relative dielectric constant than the third insulating film. The third insulating film forming step includes forming an insulating film under a pressure of 500 Pa or less by use of a plasma CVD technique using alkylalkoxysilane and a nonoxidizing gas as material gases. The alkylalkoxysilane is represented by the formula $R_wSi_xO_y(OR')_z$. R and R' each represent $CH_3$. w, x, and z denote positive integers. y denotes 0 or a positive integer. (w/x) is equal to 2.

Other and further objects, features and advantages of the invention will appear more fully from the following description.

DETAILED DESCRIPTION OF THE PREFERRED EMBODIMENTS

Figure 1:
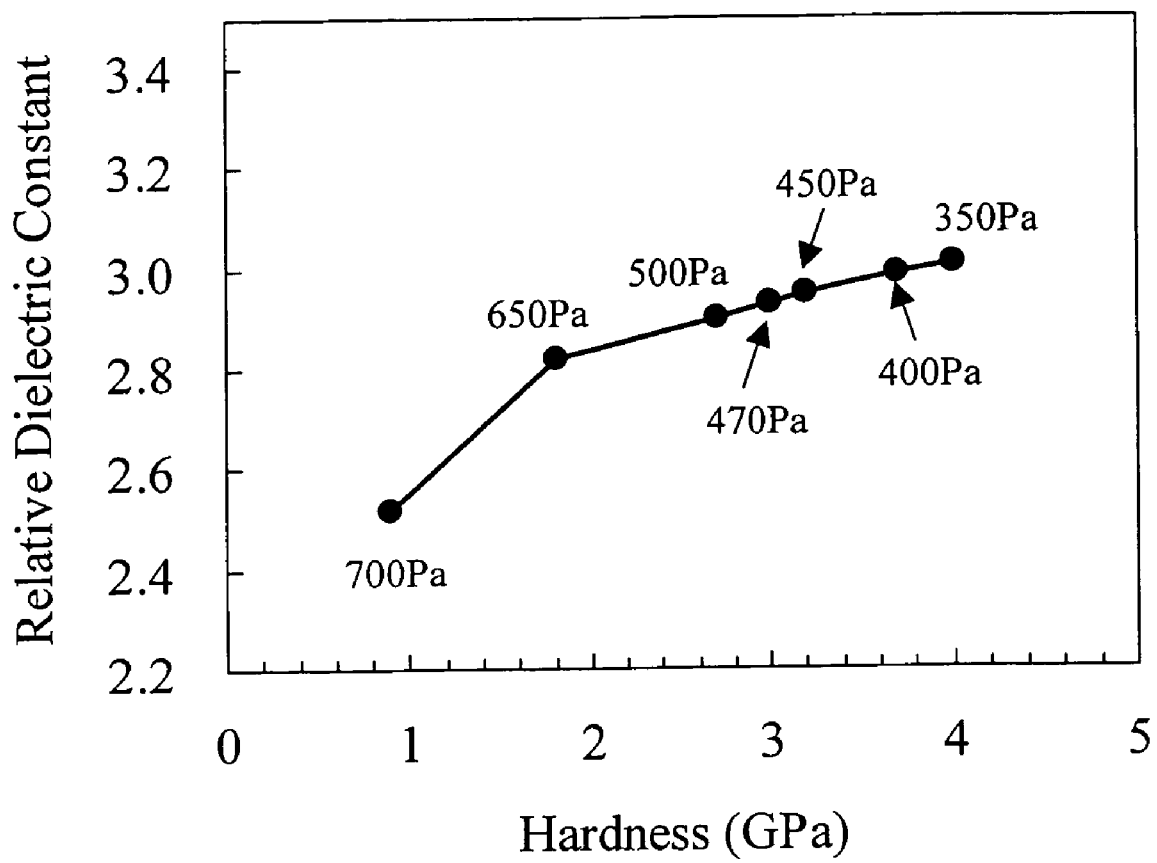
FIG. 1 shows how a hardness and relative dielectric constant of organic siloxane insulating film of the invention varied with pressure.

The term "altered layer" as used in this specification refers to a layer having a ratio of C atoms to Si atoms not grater than 0.1 formed as a result of carbon leaving an organic siloxane insulating film due to a reducing plasma treatment. It should be noted that other components may also leave the organic siloxane insulating film when carbon leaves the film.

According to the above definition, the altered layer is predominantly composed of Si and O. Therefore, this structure (i.e., an organic siloxane insulating film having an altered layer formed thereon) may appear to be similar to the above structure formed by depositing an $SiO_2$ film on an organic siloxane insulating film to a large thickness and polishing the surface by the CMP method in such a way that the $SiO_2$ film is exposed. However, the altered layer of the present invention is distinctly different from the $SiO_2$ film deposited on the organic siloxane insulating film. Specifically, since the amount of erosion caused by the CMP method varies by approximately a few tens of nanometers depending on the pattern density, the thickness of the $SiO_2$ film that remains on the organic siloxane insulating film after the polishing also varies accordingly. Therefore, the difference between the maximum and minimum values of the thickness of the $SiO_2$ film may reach as much as 50% of the average value, or more. The thickness of the above altered layer, on the other hand, depends on the uniformity of the plasma treatment, which means that the difference between the maximum and minimum values of the thickness is only 20% or less of the average value.

Further, the altered layer of the present invention is also different from an altered layer (or a modifying layer) formed by an oxygen plasma treatment or helium plasma treatment to improve adhesion. For example, forming an $SiO_2$ film on the surface of an organic siloxane insulating film after plasma-treating the surface results in an altered layer being formed at the interface between these films (due to the plasma treatment). However, all of this altered layer is polished off by the following CMP process. Therefore, this altered layer is distinctly different from that of the present invention in that no portion of it remains in the final structure.

Degradation of the electrical characteristics (of the organic siloxane insulating film) due to formation of the altered layer strongly depends on the components of the organic siloxane insulating film. If an organic siloxane insulating film contains a large quantity of Si—$CH_3$ bonds or reaction byproducts (impurities) per unit volume, C and H leave the film due to the action of the reducing plasma, resulting in a significant reduction in the film density and hence a degradation in the quality of the altered layer. It should be noted that in this case, the lower the film density after the decomposition of C and H, the more easily the reducing plasma penetrates into the film and hence the thicker the altered layer. This means that the electrical characteristics of the organic siloxane insulating film is more significantly affected by the altered layer.

On the other hand, an Si—O—Si bond is not decomposed by reducing plasma. Further, an Si—C—Si bond is transformed by reducing plasma into an Si—N—Si bond or Si—O—Si bond, which means that the reducing plasma does not significantly reduce the density of an altered layer containing a large quantity of these bonds. Therefore, to increase the density of the altered layer, it is necessary to reduce the quantities of Si—$CH_3$ bonds and reaction byproducts and increase the quantities of Si—O—Si bonds and Si—C—Si bonds. However, simply reducing the amount of carbon within the film and increasing the quantity of Si—O—Si bonds leads to a structure similar to the structure of an $SiO_2$ film though the altered layer becomes dense. This means that the organic siloxane insulating film has an increased relative dielectric constant, failing to function as a Low-k film.

The above consideration has led the present inventor to the idea of the present invention that it is useful to reduce the proportions of Si—$CH_3$ bonds and byproducts and instead increase the proportion of Si—C—Si bonds while maintaining the amount of carbon required to achieve a reduced dielectric constant.

Incidentally, Si—$CH_3$, Si—C—Si, and Si—O—Si bonds within an organic siloxane insulating film can be identified by Fourier transform infrared absorption spectrophotometry (hereinafter referred to as "FTIR"), etc. However, it is difficult to quantitatively analyze these bonds.

To address this problem, the present invention uses the hardness of the film as a measure of the quantity of these bonds. The hardness of an organic siloxane insulating film increases with increasing amount of components contributing to network bonding per unit volume within the film. It should be noted that the components contributing to network bonding are Si—O—Si bonds and Si—C—Si bonds. On the other hand, Si—$CH_3$, which terminates bonds, and reaction byproducts, which are contained in the film as impurities, do not contribute to network bonding. Therefore, the larger the amount of these substances, the less hard the film. That is, according to the present invention, the insulating film preferably has high hardness and low relative dielectric constant.

The organic siloxane insulating film of the present invention has a ratio of carbon atoms to silicon atoms between 0.5 and 1.0 (that is, $0.5 \leq (C/Si) \leq 1.0$). If the insulating film contains too small an amount of carbon, its relative dielectric constant cannot be reduced to 3.1 or less. If, on the other hand, the insulating film contains too large an amount of carbon, an sufficient etching selectivity ratio cannot be ensured when a resist pattern is formed on the film. Both of the above cases are undesirable.

The organic siloxane insulating film of the present invention is formed by the plasma CVD method using a mixed gas consisting of alkylalkoxysilane vapor (represented by the following general formula (1)) and a nonoxidizing gas. Suitable examples of nonoxidizing gases include inert gases such as He (helium), Ar (argon), $N_2$ (nitrogen), and mixtures thereof.

$$R_w Si_x O_y (OR')_z \qquad (1)$$

In the above formula (1), R and R' each represent $CH_3$. Further, w, x, and z denote positive integers, y denotes 0 or a positive integer, and (w/x)=2.

Specifically, two Si—OR' bonds bond together to form an Si—O—Si bond. Further, portions of decomposed Si—$CH_3$ bonds bond together to form an Si—C—Si bond.

The present invention uses a nonoxidizing gas, not an oxidizing gas, to form an organic siloxane insulating film. The reason for this is that Si—$CH_3$ bonds and Si—C—Si bonds decompose under an oxidizing gas atmosphere. However, since an oxidizing gas is not used, the reaction products generated from the unnecessary organic component (R') tend to remain within the film. To prevent this from happening, it is desirable to reduce the C and H contents of R' as well as reducing the number of R' components. Specifically, it is preferable that R' is $CH_3$ and the number of R' components is 2 or less per Si atom, that is, $(z/x) \leq 2$.

As example 1, organic siloxane insulating film samples were formed by supplying $(CH_3)_2Si(OCH_3)_2$ (dimethyldimethoxysilane) gas and He gas to the deposition system at flow rates of 200 sccm and 100 sccm, respectively and setting the deposition system such that the pressure within the system was 350 Pa-700 Pa, the substrate temperature was 375° C., and the RF power was 1,300 W.

Then, bonds within the formed film samples were identified by FTIR; Si—O—Si and Si—CH$_3$ bonds and Si—C—Si bonds generated as a result of decomposition of Si—CH$_3$ bonds were able to be observed. In this case, the number of Si—CH$_3$ bonds decreased and the number of Si—C—Si bonds increased with decreasing pressure within the decomposition chamber when the films were formed.

The ratio of carbon atoms to silicon atoms (C/Si) was measured by Rutherford back scattering (RBS) to be 0.84 to 0.86, that is, substantially constant, regardless of conditions.

Further, the hardness and the relative dielectric constant were measured using organic siloxane insulating film formed under the same condition as above example 1. FIG. 1 shows how the hardness and relative dielectric constant varied with the pressure. The figure indicates that the higher the hardness, the higher the relative dielectric constant. Further, both the hardness and the relative dielectric constant tended to increase with decreasing pressure. Specifically, when the pressure was 500 Pa or less, the hardness was 2.7 GPa or more; when the pressure was 470 Pa or less, the hardness was 3.0 GPa or more. Its relative dielectric constant was 3.1 or less at pressures of 350 Pa to 700 Pa though the relative dielectric constant also increased with decreasing pressure. It should be noted that the hardness and the relative dielectric constant were measured by nanoindentation method using 600 nm thick samples and by the mercury prove method using the 200 nm thick samples, respectively.

As example 2, organic siloxane insulating film samples were formed by supplying a mixed gas consisting of (CH$_3$)$_4$Si$_2$O(OCH$_3$)$_2$ and He to the deposition system. The other conditions were the same as those for example 1. In this case, a film having a relative dielectric constant of 2.7 and a hardness of 3.0 GPa was obtained when the pressure was 400 Pa.

It should be noted that organic siloxane insulating film samples were further formed under the same conditions as example 1 and example 2 using Ar gas or N$_2$ gas as the reaction gas, instead of He gas. No significant difference was found between the characteristics of these film samples and those of example 1 and example 2.

Based on the above experimental results, the present invention uses an interlayer insulating film which contains silicon, carbon, and oxygen (the ratio of carbon atoms to silicon atoms is 0.5 to 1.0) and which has a relative dielectric constant of 3.1 or less and a hardness of 2.7 GPa or more. This insulating film is formed under a pressure of 500 Pa or less by the plasma CVD method using alkylalkoxysilane (represented by the general formula: R$_w$Si$_x$O$_y$(OR')$_z$) and a nonoxidizing gas as material gases. However, the interlayer insulating film is preferably set to a relative dielectric constant of 3.1 or less and a hardness of 3.0 GPa or more to improve the quality of the altered layer formed on the surface of the interlayer insulating film. Such an interlayer insulating film is formed under a pressure of 470 Pa or less by the plasma CVD method using the same material gases as described above.

The above patent document 3 discloses an organic SOG film having a relative dielectric constant of 3 or less and a Young's modulus of less than 50 GPa. The technique disclosed in the document forms an insulating film having a Young's modulus of 50 GPa or more between the SOG film and the electrode pads to prevent occurrence of cracking due to the low mechanical strength of the SOG film. On the other hand, the present invention is characterized in that it employs an interlayer insulating film having a ratio of carbon atoms to silicon atoms between 0.5 and 1.0, a relative dielectric constant of 3.1 or less, and a hardness of 2.7 GPa or more, determined by comparing the hardnesses, relative permittivities, and etching selectivity ratios of sample films and based on the relationship between the quality of the altered layer and the hardness of the interlayer insulating film. Therefore, the present invention is distinctly different from the technique disclosed in the patent document 3. Further, based on the relationship shown in FIG. 1, the present invention may employ an interlayer insulating film having a hardness between 2.7 GPa and 4.0 GPa, preferably between 3.0 GPa and 4.0 GPa.

Then, an organic siloxane insulating film sample having a thickness of 100 nm formed under the same conditions as example 1 was subjected to an ammonia plasma treatment by use of parallel plate plasma CVD equipment. It should be noted that the treatment conditions were the same as those for the above reducing plasma treatment carried out after polishing by the CMP method.

Figure 2:
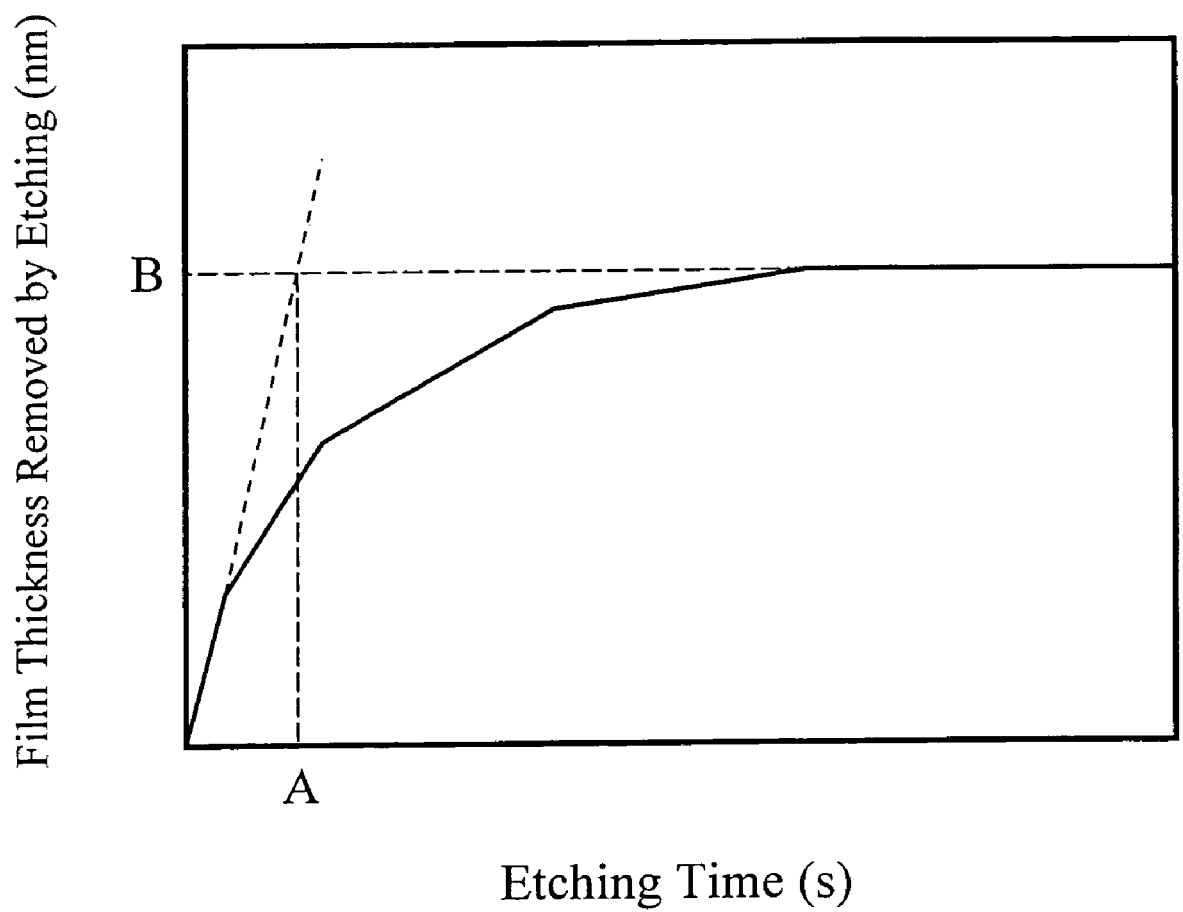
FIG. 2 shows the relationship between etching time and a film thickness removed by wet-etching of the organic siloxane insulating film.

After 30 seconds of the ammonia plasma treatment, the etching rate of the film sample was examined using 0.5% dilute hydrofluoric acid. FIG. 2 shows the relationship between the etching time and the film thickness removed by the etching. As shown in the figure, the etching rate decreased over time. When the removed film thickness had reached point B in the figure (that is, when the entire altered layer had been removed), the etching rate became zero. The time required for the etching rate to reach zero was typically approximately 2 minutes. Further, the FTIR spectrum of the sample was measured before and after the etching process. The difference between the spectrum measurements before and after the etching process constitutes the spectrum of the altered layer. The altered layer was found to include no organic components such as Si—CH$_3$.

Figure 3:
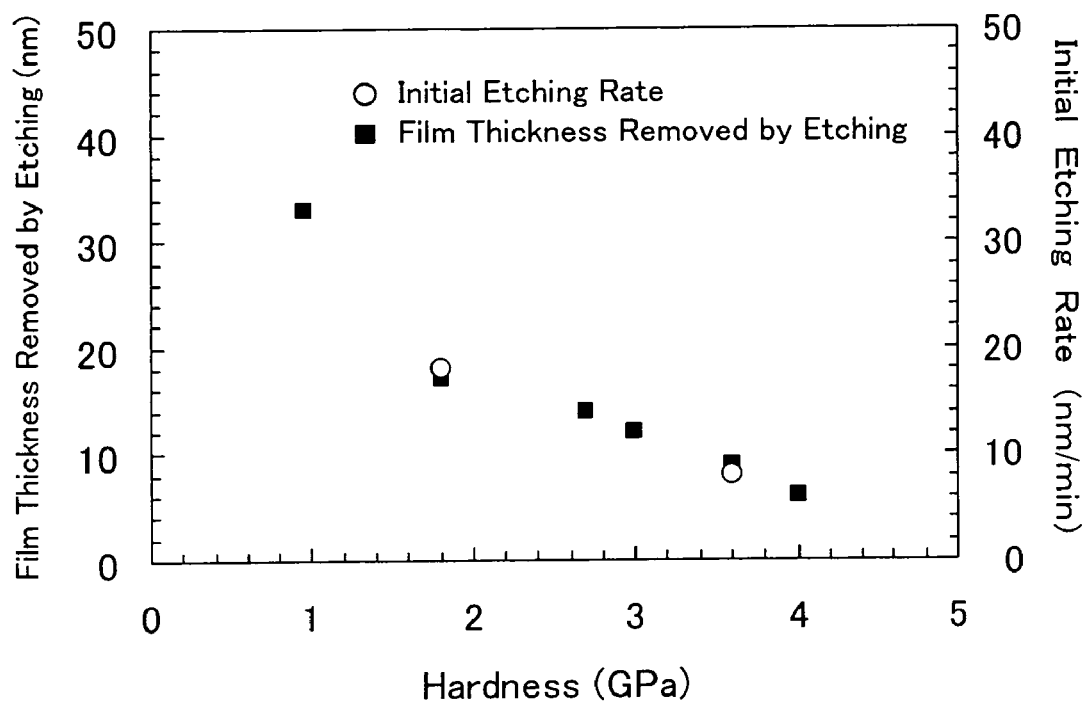
FIG. 3 shows how a film thickness and an initial etching rate changed with the hardness of the organic siloxane insulating film.

FIG. 3 shows how the thickness (denoted by B) of the altered layer and the initial etching rate (B/A, where A denotes the etching time) changed with the hardness of the film. As shown in the figure, the thickness of the altered film decreased with increasing hardness. Further, the etching rate also decreased with increasing hardness, indicating that the altered layer became denser as the hardness of the film increased.

As shown in FIG. 3, when the hardness was 3.6 GPa, the etching rate was 9.2 nm/min, which is approximately equal to the etching rate (11 nm/min) of the SiO$_2$ film formed by the plasma CVD method. Further, when the hardness was 2.7 GPa or more, the thickness of the altered layer was 14 nm or less. When the hardness was 3.0 GPa or more, the thickness of the altered layer was 12 nm or less. Further, the in-plane uniformity of the thickness of the altered layer was checked. The difference between the maximum and minimum values of the thickness was 20% or less of the average value. Thus, according to the present invention, an insulating film having a hardness of 2.7 GPa or more may be formed, so that an altered layer having a thickness approximately between 5 nm and 15 nm is formed on the insulating film.

It should be noted that organic siloxane insulating film samples formed under the same conditions as the above example 2 also exhibited the same tendencies as those shown in FIGS. 2 and 3.

Then, organic siloxane insulating film samples were formed on silicon substrates to a thickness of 500 nm under the same conditions as example 1. Then, each sample was processed as follows. An SiO$_2$ film was formed on the sample to a thickness of 30 nm, and an opening was formed using a resist pattern as a mask. After removing the resist pattern, a tantalum nitride film and a tantalum film were formed on the sample as a barrier metal film to a combined thickness of 20 nm, and then a copper layer was formed thereon. Then, the entire SiO$_2$ film and a portion of the organic siloxane insulating film were polished off by the CMP method to form a copper wiring layer. After that, the exposed surfaces of the organic siloxane insulating film and the copper layer were subjected to an ammonia plasma treatment, and then an SiCN film was formed thereon as a barrier insulating film.

Figure 4:
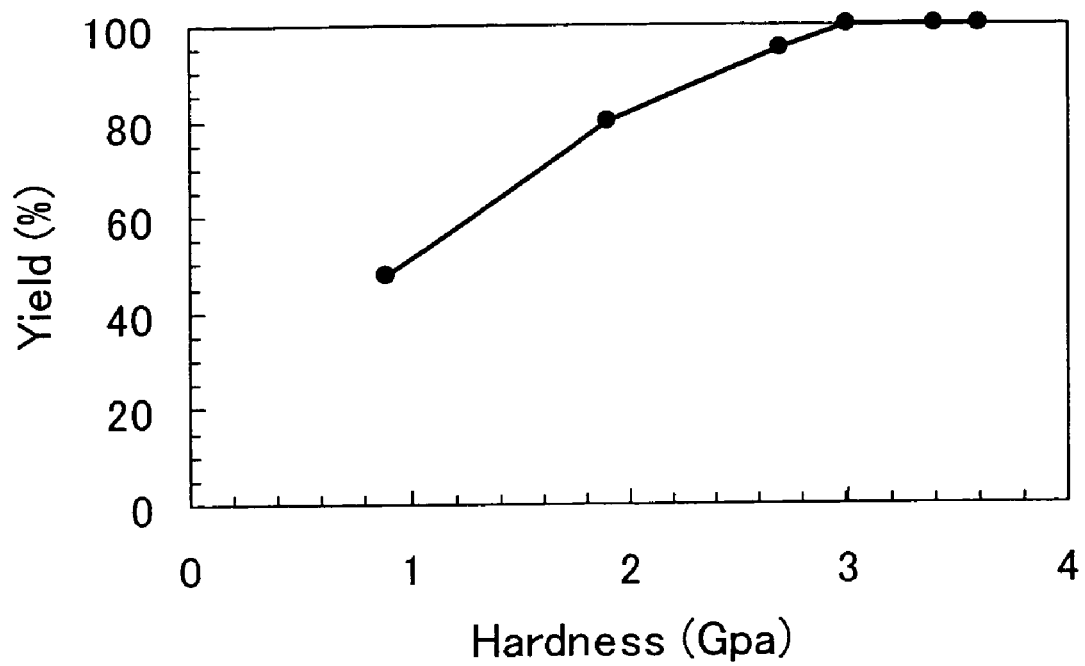
FIG. 4 shows the relationship between a hardness and a premature failure of the organic siloxane insulating film.

The obtained substrate sample was heated to 140° C., and an electric field was applied between insulated neighboring wires to see how the leakage current changes over time. It should be noted that the distance between the neighboring wires was 140 nm. The time at which a dielectric breakdown occurred in each sample was measured and analyzed statistically. Analysis of the results indicated that there were two types of failure modes: premature failure and intrinsic failure. Since there had been a sufficient lifetime before each intrinsic failure occurred, the premature failure was determined to be more important and the relationship between the hardness and the premature failure was obtained, as indicated in FIG. 4. As shown in the figure, the higher the hardness, the lower the rate of occurrence of premature failure. Specifically, when the hardness was 2.7 GPa or more, the yield was 97% or more, which is practically acceptable. Further, when the hardness was 3.0 GPa or more, the yield was 100%, achieving a more preferable reliability level.

It should be noted that organic siloxane insulating film samples formed under the same conditions as the above example 2 also exhibited the same tendencies as those shown in FIG. 4.

There will now be described a method for manufacturing a semiconductor device according to the present invention with reference to FIGS. 5 to 15. It should be noted that the description of general LSI manufacturing processes such as formation of transistors, diffusion layers, and plugs will be omitted for simplicity, and the metal wiring forming process will be described below.

Figure 5:
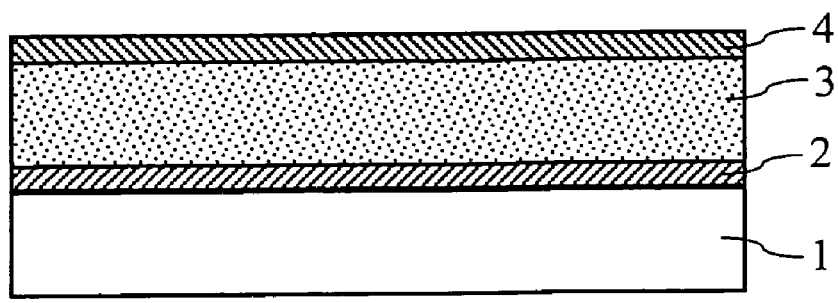
FIGS. 5 to 14 show a method for manufacturing a semiconductor device according to the present invention.

First of all, a semiconductor substrate having underlayer wiring 1 formed thereon is prepared (see FIG. 5). The semiconductor substrate may be, for example, a silicon substrate. It should be noted that the figure does not show the structure of the underlayer wiring 1, for simplicity.

Then, a first insulating film 2, a second insulating film 3, and a third insulating film 4 are formed over the underlayer wiring 1 in that order, as shown in FIG. 5. It should be noted that the first insulating film 2 is a barrier insulating film and may be an insulating film including N (nitrogen), such as an SiN film or SiCN film. Further, the second insulating film 3 is an organic siloxane insulating film of the present invention. The third insulating film 4 may be an SiO$_2$ film.

Figure 6:
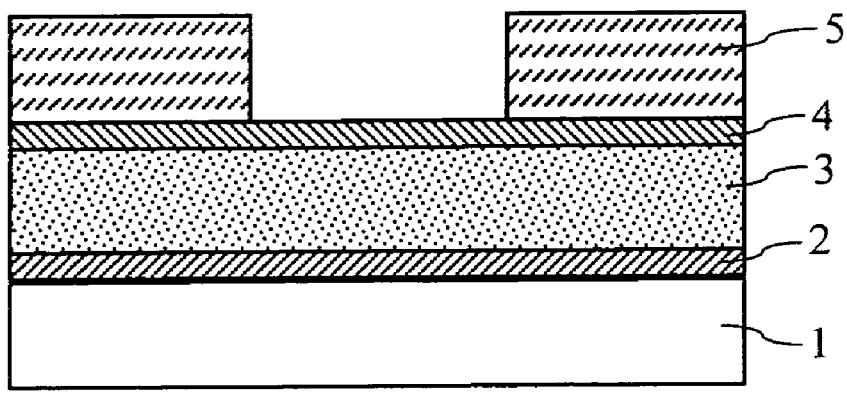

After forming the third insulating film 4, a resist film 5 having a predetermined pattern is formed, as shown in FIG. 6. Specifically, the entire surface of the third insulating film 4 is coated with a photoresist (not shown) and irradiated with exposure light through a mask (not shown) having a predetermined pattern. Then, the photoresist is developed in an appropriate developing solution to form the photoresist film 5 having a predetermined pattern.

Different types of exposure light may be used for different semiconductor device design rules. For example, KrF (krypton fluoride) excimer laser (having a wavelength of 248 nm) is used for the design rules 0.25 μm to 0.13 μm as the light source of the scanner. On the other hand, ArF (argon fluoride) excimer laser (having a wavelength of 193 nm) is used for the design rules 90 nm to 65 nm.

Figure 7:
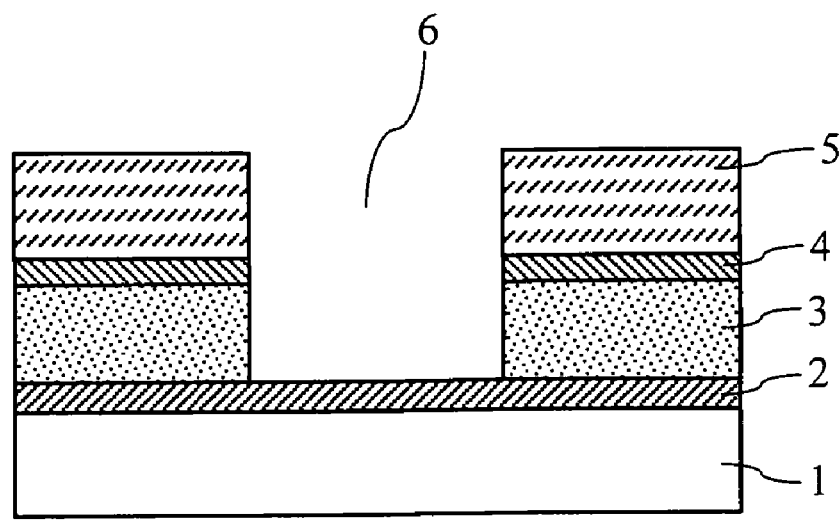

Then, first dry etching is performed on the third insulating film 4 and the second insulating film 3 using the resist film 5 as a mask. This dry etching automatically stops when the first insulating film 2 has been exposed, forming an opening 6 reaching the first insulating film 2, as shown in FIG. 7.

Figure 8:
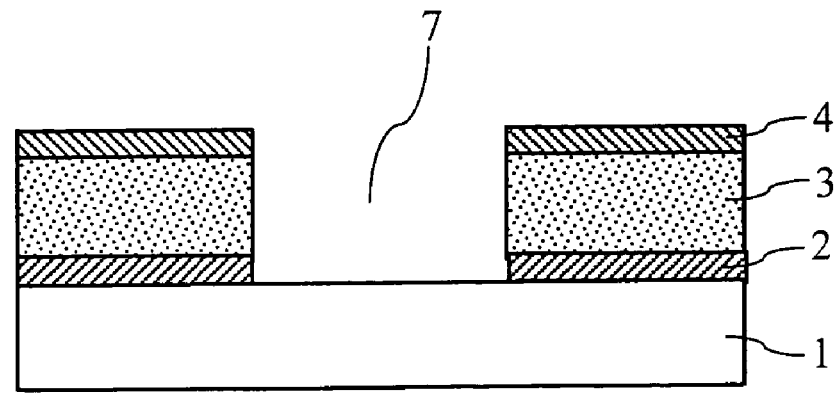
Figure 9:
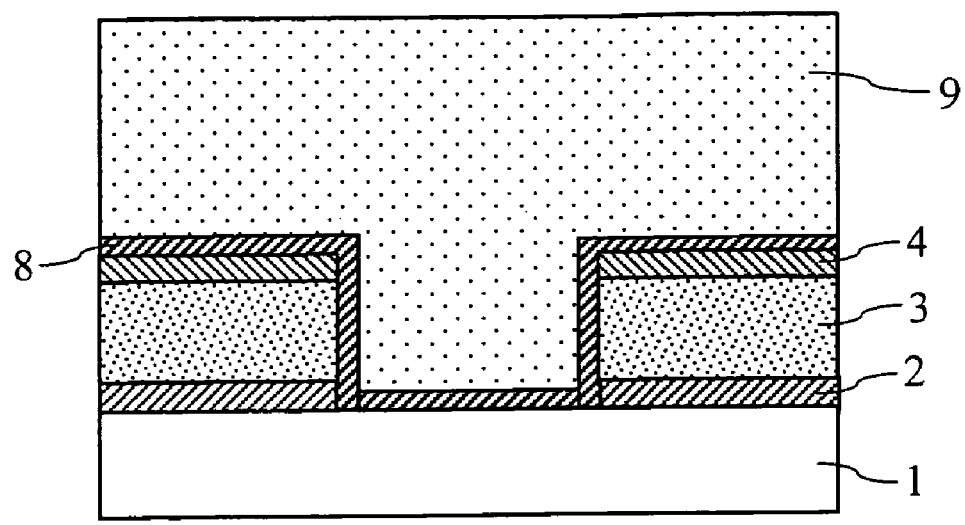

Then, after removing the resist film 5 by use of low pressure oxygen plasma, second dry etching is performed on the first insulating film 2 using the third insulating film 4 and the second insulating film 3 as masks. This forms an opening 7 reaching the underlayer wiring 1, as shown in FIG. 8. It should be noted that the opening 7 may be either a wiring groove or a wiring hole.

It should be noted that an modified layer is formed on the inner surface of the opening 7 as a result of the above low pressure plasma treatment. However, this modified layer is different from the insulating layer (or altered layer) of the present invention having a ratio of carbon atoms to silicon atoms not greater than 1.0 formed as a result of carbon leaving an organic siloxane insulating film, because the altered layer of the present invention is formed on the top of the insulating film.

Then, a barrier metal film is formed on the inner surface of the opening 7, and a copper layer is formed on the barrier metal film such that the copper layer is buried in the wiring groove (the opening). Specifically, this process is performed as follows.

First of all, a film stack made up of a tantalum nitride film and a tantalum film is formed on the inner surface of the opening 7 and on the third insulating film 4 as a barrier metal film 8. The thickness of the barrier metal film 8 may be, for example, approximately 20 nm. Then, a copper layer 9 (acting as a conductive layer) is formed on the barrier metal film 8 such that the opening 7 is buried under the copper layer 9, producing the structure shown in FIG. 9.

Figure 10:
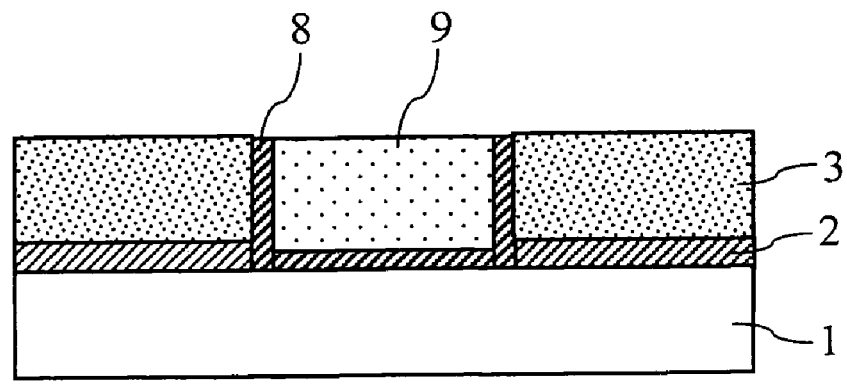

After that, the copper layer 9 and the barrier metal film 8 are polished by the CMP method. At that time, the entire third insulating film 4 and a portion of the second insulating film 3 are polished off to enhance flatness of the surface. This allows the copper layer 9 and the barrier metal film 8 to remain only inside the opening 7, forming first wiring 10 electrically connected to the underlayer wiring 1. It should be noted that the second insulating film 3 is exposed as a result of the above polishing, as shown in FIG. 10.

Figure 12:
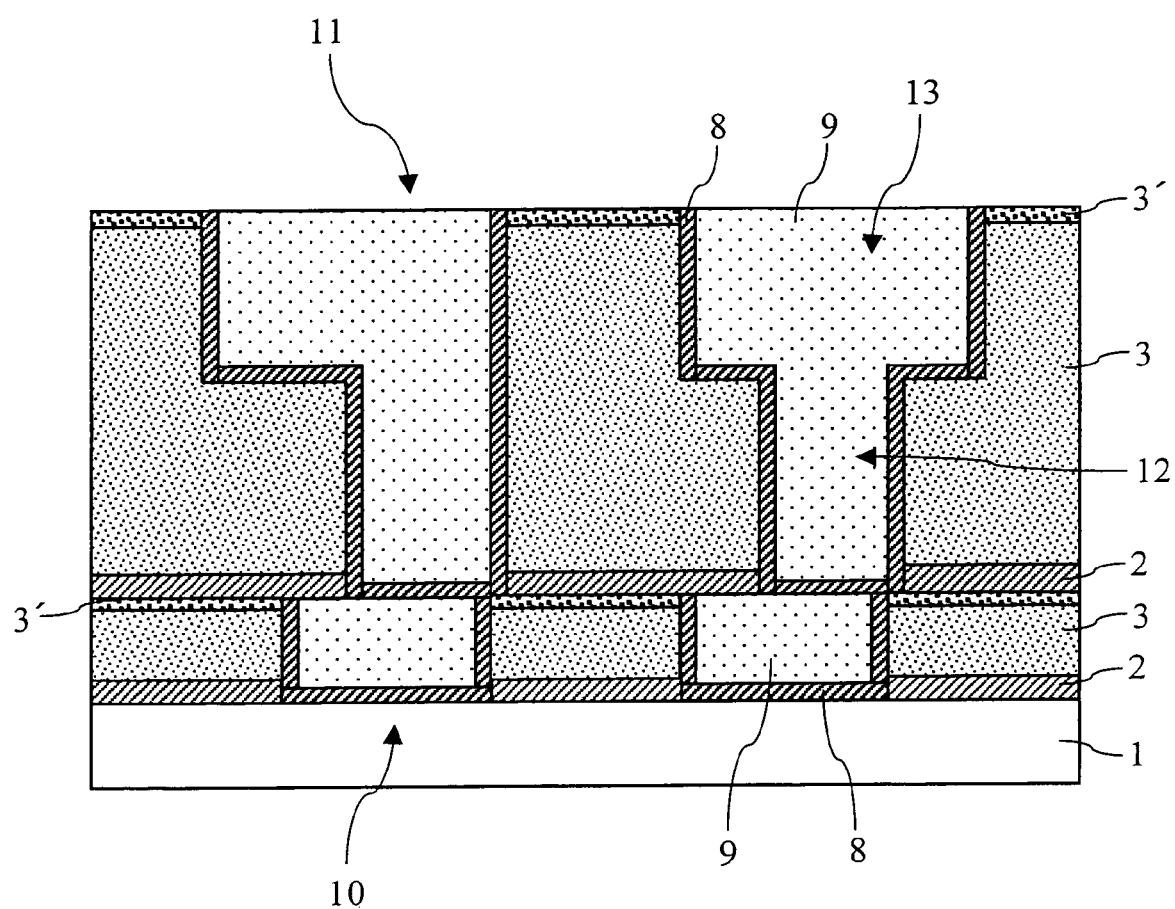

Then, a reducing plasma treatment using ammonia is carried out to reduce the surface of the copper layer 9 and clean the surface of the second insulating film 3. As a result, carbon within the second insulating film 3 is reduced, forming an altered layer 3', as shown in FIG. 12. The thickness of the altered layer 3' is, for example, approximately 12 nm. It should be noted that hydrogen may be used instead of ammonia, or both ammonia and hydrogen may be used.

Figure 11:
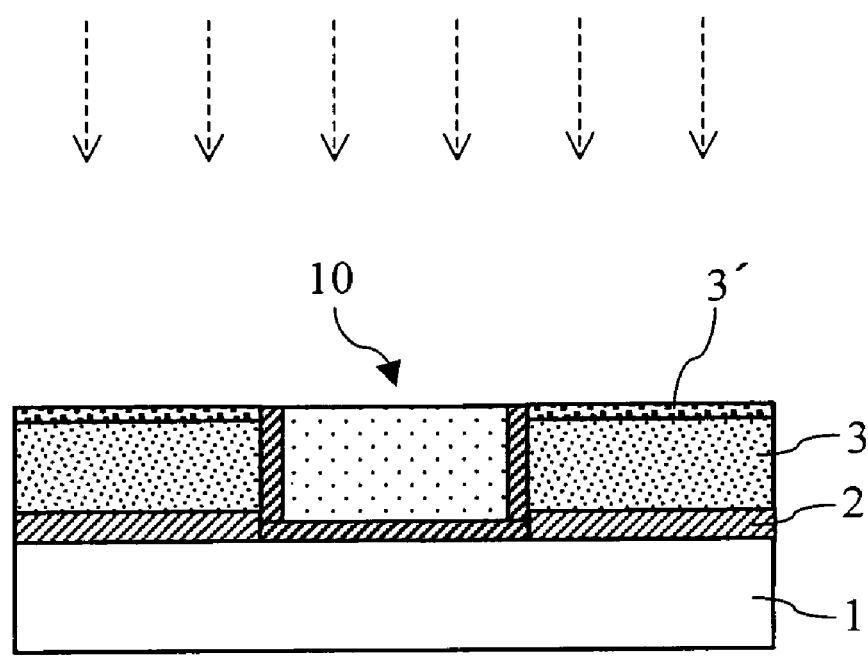

Thus, the above process forms a wiring layer by using an organic siloxane insulating film according to the present invention (see FIG. 11).

Then, steps similar to those shown in FIGS. 5 to 11 are performed using a via-first dual damascene technique to form second wiring 11 electrically connected to the first wiring 10, as shown in FIG. 12. Such steps may be further repeated to form a multilayer wiring structure.

In FIG. 12, a wiring groove 13 and a via hole 12 connected to the wiring groove 13 are provided in the second insulating film 3. Further, the wiring groove 13 and the via hole 12 are filled with the copper layer 9, forming the second wiring 11.

According to the present embodiment, a film stack of a plurality of organic siloxane insulating films having different hardnesses and different relative permittivities may be used to form a wiring layer. Specifically, an insulating film having lower relative dielectric constant than an organic siloxane insulating film of the present invention (hereinafter referred to as "low dielectric constant insulating film") may be formed under and in contact with the organic siloxane insulating film.

For example, in the above step of forming the second insulating film, an organic siloxane insulating film having a predetermined thickness may be formed under a pressure of 650 Pa or more by the plasma CVD method using alkylalkoxysilane (represented by formula (1)) and a nonoxidizing gas as material gases, and then another insulating film may be formed thereon after reducing the pressure to 500 Pa or less. As a result, the underlayer insulating film has a relative dielectric constant of 2.8 or less and a hardness of 1.8 GPa or less, and the upper layer insulating film has a relative dielectric constant of 3.1 or less and a hardness of 2.7 GPa or more (see FIG. 1). (Both insulating films include silicon, carbon, and oxygen and have a ratio of carbon atoms to silicon atoms between 0.5 and 1.0.) In this case, the relative dielectric constant of the underlayer insulating film is preferably set to 2.6 or less to reduce the capacitance between neighboring wires.

As example 3, for a first wiring layer, an organic siloxane insulating film having a hardness of 3.0 GPa and a thickness of 250 nm is formed using $(CH_3)_4Si_2O(OCH_3)_2$ as a material. After that, for a second wiring layer, an organic siloxane insulating film having a hardness of 0.9 GPa and a thickness of 400 nm is formed and then an organic siloxane insulating film having a hardness of 3.0 GPa and a thickness of 100 nm is further formed. It should be noted that the material gas may be the same as that used to form the first insulating film. The wiring layers above the second wiring layer are formed in the same manner as the second wiring layer.

Figure 13:
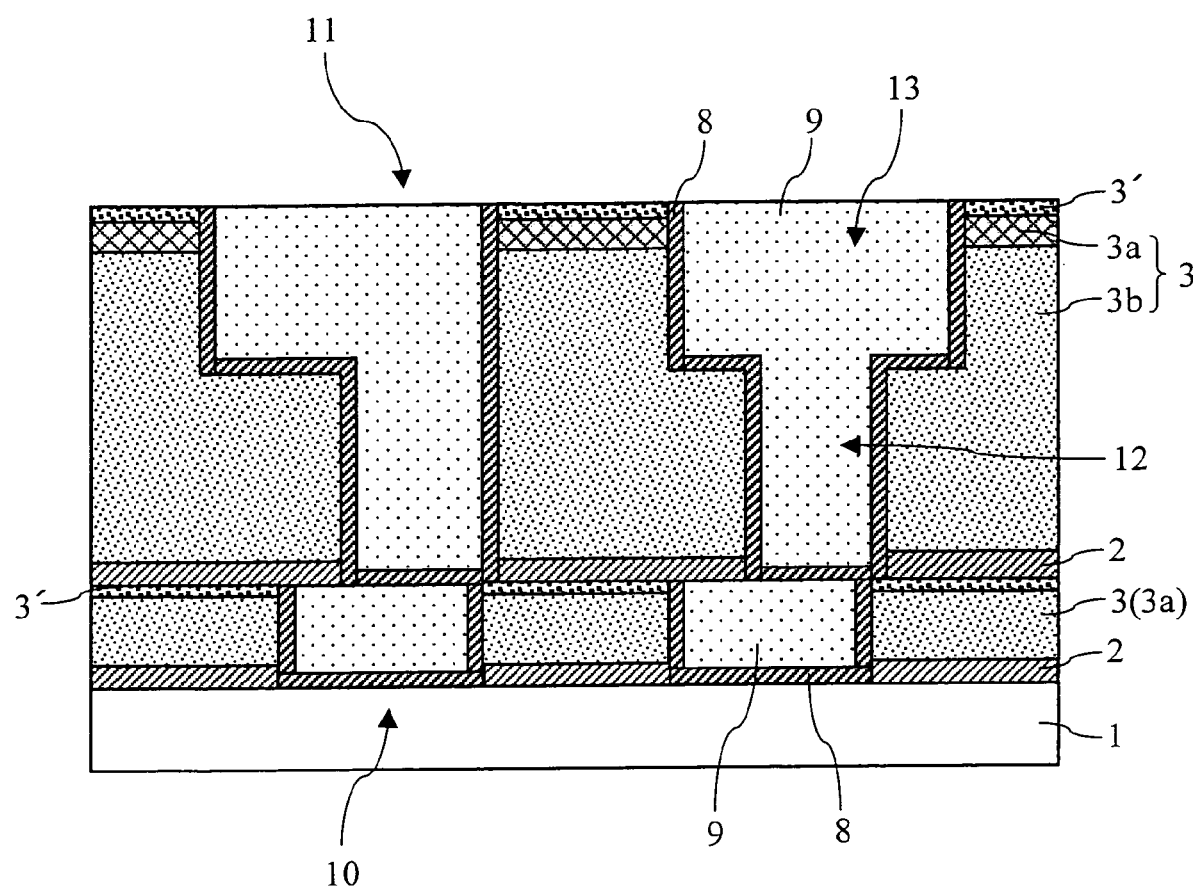

FIG. 13 shows the structure formed by the above process. The structure shown in FIG. 13 is different from that shown in FIG. 12 in that the second insulating film 3 of the second wiring layer 11 is made up of a first organic siloxane insulating film 3a and a second organic siloxane insulating film 3b. It should be noted that the second insulating film 3 of the first wiring layer 10 is made up of only a first organic siloxane insulating film 3a. The first organic siloxane insulating films 3a have a hardness of 3.0 GPa, while the second organic siloxane insulating film 3b has a hardness of 0.9 GPa. The altered layers 3' are formed on the surfaces of the first organic siloxane insulating films 3a since these insulating films are exposed to reducing plasma. It should be noted that the wiring layers (not shown) formed above the second wiring layer 11 may have the same structure as the second wiring layer 11.

In the structure shown in FIG. 13, the via hole 12 connected to the wiring groove 13 is provided in a portion of the second organic siloxane insulating film 3b (or the low dielectric constant insulating film). Further, the wiring groove 13 is provided in another portion of the second organic siloxane insulating film 3b and in a first siloxane insulating film 3a. The wiring groove 13 and the via hole 12 are filled with the copper layer 9, forming the second wiring 11. This structure allows the capacitance between neighboring wires to be reduced, as described below.

As shown in FIG. 1, when the hardness is 3.0 GPa, the relative dielectric constant is 2.93; and when the hardness is 0.9 GPa, the relative dielectric constant is 2.52. Therefore, setting the first and second organic siloxane insulating films to the above respective thickness values allows the parasitic capacitance to be reduced by approximately 10%, as compared to when each wiring layer is formed of only a single organic siloxane insulating film or of a plurality of organic siloxane insulating films having the same hardness. It should be noted that $(CH_3)_4Si_2O(OCH_3)_2$ may be used, instead of $(CH_3)_2Si(OCH_3)_2$, with the same effect.

As example 4, for a first wiring layer, an organic siloxane insulating film having a hardness of 3.0 GPa and a thickness of 250 nm is formed using $(CH_3)_4Si_2O(OCH_3)_2$ as a material. After that, for a second wiring layer, three organic siloxane insulating films are sequentially formed. The first one has a hardness of 3.0 GPa and a thickness of 200 nm, the second one has a hardness of 0.9 GPa and a thickness of 200 nm, and the third one has a hardness of 3.0 GPa and a thickness of 100 nm. It should be noted that the material gas may be the same as that used to form the first insulating film. The wiring layers above the second wiring layer are formed in the same manner as the second wiring layer. This structure allows the parasitic capacitance to be reduced by 5%, as compared to when each wiring layer is formed of only a single organic siloxane insulating film or of a plurality of organic siloxane insulating films having the same hardness. It should be noted that $(CH_3)_4Si_2O(OCH_3)_2$ may be used, instead of $(CH_3)_2Si(OCH_3)_2$, with the same effect.

Figure 14:
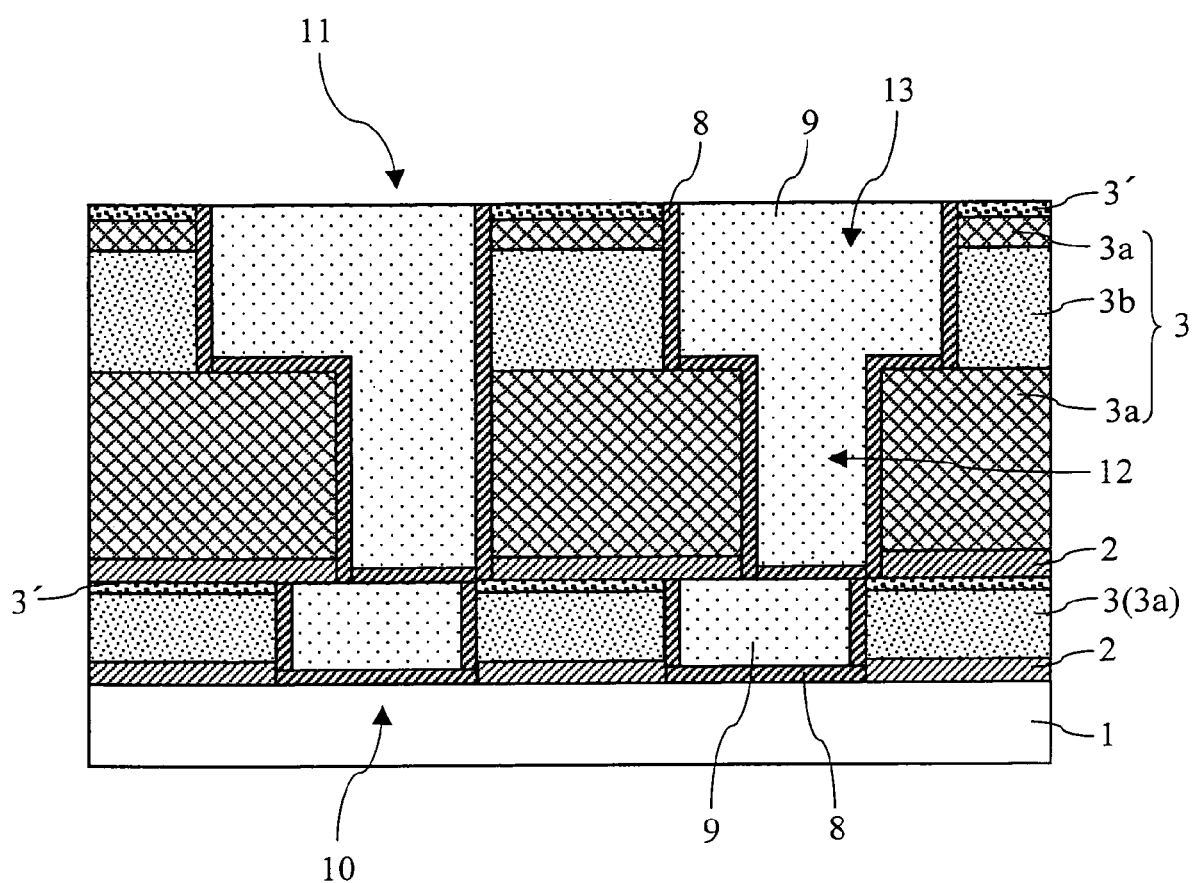

FIG. 14 shows the structure formed by the above process. The structure shown in FIG. 14 is different from that shown in FIG. 13 in that the second insulating film 3 of the second wiring layer is made up of a first organic siloxane insulating film 3a, a second organic siloxane insulating film 3b, and another first organic siloxane insulating film 3a. The first organic siloxane insulating films 3a have a hardness of 3.0 GPa, while the second organic siloxane insulating film 3b has a hardness of 0.9 GPa. The second insulating film 3 of the first wiring layer 10 is made up of only a first organic siloxane insulating film 3a. The altered layers 3' are formed on the surfaces of the first organic siloxane insulating films 3a since these insulating films are exposed to reducing plasma. It should be noted that wiring layers (not shown) formed above the second wiring layer 11 may have the same structure as the second wiring layer 11.

In the structure shown in FIG. 14, the via hole 12 connected to the wiring groove 13 is provided in a first organic siloxane insulating film 3a. Further, the wiring groove 13 is provided in the second organic siloxane insulating film 3b (or the low dielectric constant insulating film) and in a first organic siloxane insulating film 3a. The wiring groove 13 and the via hole 12 are filled with the copper layer 9, forming the second wiring 11. This structure allows the capacitance between neighboring wires to be reduced while preventing an increase in the resistance, as described below.

Semiconductor devices having a 5-layer wiring structure were manufactured according to the above examples 1 to 4. It should be noted that examples 1 and 2 correspond to the structure shown in FIG. 12. Further, examples 3 and 4 correspond to the structures shown in FIGS. 13 and 14, respectively. The semiconductor devices were subjected to a stress migration test at 200° C. for 500 hours. The differences between the via connection resistance measurements before and after the test were checked. The rate of increase in the resistance of the semiconductor device produced according to example 4 was approximately equal to those of the semiconductor devices according to examples 1 and 2. On the other hand, the rate of increase in the resistance of the semiconductor device according to example 3 was approximately twice that of the semiconductor device according to example 4. However, this rate is also practically acceptable.

Further, according to the present invention, upper layer wiring electrically connected to underlayer wiring may be formed as follows. First of all, first to fourth insulating films are sequentially formed over the underlayer wiring. Then, these insulating films are dry-etched to form an opening reaching the underlayer wiring. After that, a barrier metal film and a conductive layer are sequentially formed on the inner surface of the opening and on the fourth insulating film such that the conductive layer fills the opening. Then, the conductive layer, the barrier metal film, the fourth insulating film, and a portion of the third insulating film are polished off by the chemical mechanical polishing method such that the conductive layer and the barrier metal film still remain in the opening, thus forming the upper layer wiring electrically connected to the underlayer wiring. In this case, the exposed surfaces of the third insulating film and the conductive layer are subjected to reducing plasma treatment. It should be noted that the first insulating film is a barrier insulating film, the third insulating film is an organic siloxane insulating film of the present invention, and the fourth insulating film is an $SiO_2$ film.

In the above example, the step of forming the second insulating film forms an insulating film having a lower relative dielectric constant than the third insulating film. That is, the second insulating film is not limited to organic siloxane insulating films. It can be any insulating film that has a lower relative dielectric constant than the third insulating film. On the other hand, the third insulating film is formed under a pressure of 500 Pa or less by the plasma CVD method using alkylalkoxysilane (represented by formula (1)) and a nonoxidizing gas as material gases. As a result, the third insulating film has a hardness of 2.7 GPa or more. It should be noted that the hardness of the third insulating film may be set to 3.0 GPa or more to improve the quality of the altered layer. In this case, the pressure under which the film is formed is preferably 470 Pa or less.

This method produces a variation of the structure of FIG. 14 in which the second organic siloxane insulating film 3b has been replaced by the second insulating film. Therefore, it is possible to densify the altered layer formed as a result of the reducing plasma treatment and thereby prevent degradation of the electrical characteristics of the semiconductor device. This arrangement also allows the parasitic capacitance to be reduced, as compared to when each wiring layer is formed of only a single organic siloxane insulating film.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2004-199709, filed on Jul. 6, 2004 including specification, claims, drawings and summary, on which the Convention priority of the present application is based, are incorporated herein by reference in its entirety.

What is claimed is:

1. A semiconductor device comprising a multilayer wiring structure on a semiconductor substrate, wherein:
    said multilayer wiring structure comprises an interlayer insulating film having at least an organic siloxane insulating film;
    said organic siloxane insulating film has a relative dielectric constant of 3.1 or less, a hardness of 2.7 GPa or more, and a ratio of carbon atoms to silicon atoms between 0.5 and 1.0, inclusive,
    said multilayer wiring structure comprises an insulating layer having a ratio of carbon atoms to silicon atoms not greater than 0.1, said insulating layer being formed on the top surface of said organic siloxane insulating film, and wherein said insulating layer has a thickness between 5 nm and 15 nm, inclusive.

2. The semiconductor device according to claim 1, wherein said organic siloxane insulating film has a hardness of 3.0 GPa or more.

3. The semiconductor device according to claim 1, wherein said organic siloxane insulating film comprises Si—$CH_3$ bonds, Si—O—Si bonds, and Si—C—Si bonds.

4. The semiconductor device according to claim 1, wherein the difference between the maximum and minimum thicknesses of said insulating layer is 20% or less of the average thickness of said insulating layer.

5. The semiconductor device according to claim 1, wherein a barrier insulating film is formed on and in contact with said insulating layer,
    wherein a trench is formed in said insulating layer and said organic siloxane insulating film,
    wherein a via hole is formed in said organic siloxane insulating film,
    wherein a bottom of said trench is in contact with a top of said via hole,
    wherein a Cu wiring is formed in said trench and said via hole, and
    wherein said barrier insulating film is formed on and in contact with said Cu wiring.

6. The semiconductor device according to claim 1, wherein said organic siloxane insulating film has a hardness of 2.7-4.0 GPa.

7. The semiconductor device according to claim 1, wherein said organic siloxane insulating film has a hardness of 3.0-4.0 GPa.

8. The semiconductor device according to claim 1, wherein said insulating layer is formed on the top surface of said organic siloxane insulating film as a result of carbon leaving said organic siloxane insulating film.

9. A semiconductor device comprising a multilayer wiring structure on a semiconductor substrate, wherein:
    said multilayer wiring structure comprises an interlayer insulating film having at least an organic siloxane insulating film;
    said organic siloxane insulating film has a relative dielectric constant of 3.1 or less, a hardness of 2.7 GPa or more, and a ratio of carbon atoms to silicon atoms between 0.5 and 1.0, inclusive,
    said multilayer wiring structure comprises an insulating layer which has a ratio of carbon atoms to silicon atoms not greater than 0.1 and is formed on the top surface of said organic siloxane insulating film, and
    wherein a low dielectric constant insulating film is formed under and in contact with said organic siloxane insulating film, said low dielectric constant insulating film having a lower relative dielectric constant than said organic siloxane insulating film.

10. The semiconductor device according to claim 9, wherein said low dielectric constant insulating film has a relative dielectric constant of 2.8 or less, a hardness of 1.8 GPa or less, and a ratio of carbon atoms to silicon atoms between 0.5 and 1.0, inclusive.

11. The semiconductor device according to claim 9, wherein said multilayer wiring structure comprises a wiring groove and a via hole connected to said wiring groove, said wiring groove being provided in said organic siloxane insulating film and in a portion of said low dielectric constant insulating film, said via hole being provided in another portion of said low dielectric constant insulating film, said wiring groove and said via hole being filled with a conductive layer.

12. The semiconductor device according to claim 9, further comprising a first insulating film which has a relative dielectric constant of 3.1 or less, a hardness of 2.7 GPa or more, and a ratio of carbon atoms to silicon atoms between 0.5 and 1.0, inclusive, wherein said multilayer wiring structure includes a wiring groove, the first insulating film, and a via hole connected to said wiring groove, said wiring groove being provided in said organic siloxane insulating film and in said low dielectric constant insulating film, said via hole being provided in said first insulating film, said wiring groove and said via hole being filled with a conductive layer.

13. The semiconductor device according to claim 9, wherein a barrier insulating film is formed on and in contact with said insulating layer, wherein a trench is formed in said insulating layer, said organic siloxane insulating film, and said low dielectric constant insulating film, wherein a via hole is formed in said low dielectric constant insulating film, wherein a bottom of said trench is in contact with a top of said via hole, wherein a Cu wiring is formed in said trench and said via hole, wherein said barrier insulating film is formed on and in contact with said Cu wiring, and wherein said insulating layer has a thickness between 5 nm and 15 nm inclusive.

* * * * *